(12) United States Patent
Ritter et al.

(10) Patent No.: US 11,984,515 B2
(45) Date of Patent: May 14, 2024

(54) SEMICONDUCTOR DEVICE AND A METHOD OF MANUFACTURE OF A SEMICONDUCTOR DEVICE

(71) Applicant: NEXPERIA B.V., Nijmegen (NL)

(72) Inventors: Hans-Martin Ritter, Nijmegen (NL); Steffen Holland, Nijmegen (NL); Guido Notermans, Nijmegen (NL); Joachim Utzig, Nijmegen (NL); Vasantha Kumar Vaddagere Nagaraju, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 219 days.

(21) Appl. No.: 17/394,080

(22) Filed: Aug. 4, 2021

(65) Prior Publication Data
US 2022/0045222 A1    Feb. 10, 2022

(30) Foreign Application Priority Data

Aug. 5, 2020   (EP) ..................... 20189593

(51) Int. Cl.
*H01L 29/87* (2006.01)
*H01L 27/02* (2006.01)
*H01L 29/06* (2006.01)

(52) U.S. Cl.
CPC .......... *H01L 29/87* (2013.01); *H01L 27/0255* (2013.01); *H01L 29/0684* (2013.01);
(Continued)

(58) Field of Classification Search
CPC . H01L 29/87; H01L 27/0255; H01L 27/0259; H01L 27/0266; H01L 29/66121; H01L 27/0262; H01L 29/66393; H01L 29/7436; H01L 2924/13024; H01L 2924/13034–13035
See application file for complete search history.

(56) References Cited

U.S. PATENT DOCUMENTS 3,858,235 A   12/1974  Schild
6,236,087 B1  5/2001   Daly et al.
(Continued)

FOREIGN PATENT DOCUMENTS

EP   2947691 A1   11/2015

OTHER PUBLICATIONS

Extended European Search Report for corresponding European application EP20189593, 11 pages, dated Jan. 25, 2021.
(Continued)

*Primary Examiner* — Wasiul Haider
(74) *Attorney, Agent, or Firm* — Ruggiero McAllister & McMahon LLC

(57) ABSTRACT

A semiconductor device is provided that includes a first n+ region, a first p+ region within the first n+ region, a second n+ region, a second p+ region, positioned between the first n+ region and the second n+ region. The first n+ region, the second n+ region and the second p+ region are positioned within a p− region. A first space charge region and a second space charge region are formed within the p− region. The first space region is positioned between the first n+ region and the second p+ region, and the second space region is positioned between the second p+ region and the second n+ region.

19 Claims, 14 Drawing Sheets

(52) U.S. Cl.
CPC ...... *H01L 27/0259* (2013.01); *H01L 27/0266* (2013.01); *H01L 27/0288* (2013.01)

(56) References Cited

U.S. PATENT DOCUMENTS

| | | | | |
|---|---|---|---|---|
| 2010/0193904 | A1* | 8/2010 | Watt | H01L 23/5227 |
| | | | | 257/E27.011 |
| 2010/0320501 | A1* | 12/2010 | Gendron | H01L 27/0259 |
| | | | | 257/E21.369 |
| 2011/0204415 | A1 | 8/2011 | Van Wijmeersch et al. | |
| 2012/0193675 | A1* | 8/2012 | Holland | H01L 27/0262 |
| | | | | 257/E29.221 |
| 2015/0108538 | A1* | 4/2015 | Chen | H01L 21/22 |
| | | | | 257/132 |
| 2018/0342496 | A1* | 11/2018 | Stefanov | H01L 27/0255 |
| 2019/0371924 | A1* | 12/2019 | Kushner | H01L 23/5283 |
| 2020/0051971 | A1* | 2/2020 | Yeh | H01L 27/0262 |
| 2020/0273856 | A1* | 8/2020 | Lee | H01L 27/0288 |
| 2021/0005600 | A1* | 1/2021 | Russ | H01L 29/7408 |

OTHER PUBLICATIONS

Anonymous "Depletion region—Wikipedia, the free encyclopedia" (May 14, 2014) XP055219647; URL: https://en.wikipedia,org/w/index.php?title=Depletionregion&olddid=508476441.

* cited by examiner

SEMICONDUCTOR DEVICE AND A METHOD OF MANUFACTURE OF A SEMICONDUCTOR DEVICE

CROSS REFERENCE TO RELATED APPLICATION

This application claims the benefit under 35 U.S.C. § 119(a) of European Application No. 20189593.5 filed Aug. 5, 2020, the contents of which are incorporated by reference herein in their entirety.

BACKGROUND OF THE DISCLOSURE

1. Field of the Disclosure

The present disclosure relates to a semiconductor device. The disclosure also relates to a method of manufacturing a semiconductor device.

2. Description of the Related Art

It is known that electrostatic discharge (ESD) protection devices need to have low capacitance, fast turn-on and low clamping voltages at the same time.

A large capacitance would hamper data transfer. A slow turn-on would mean that the integrated circuit (IC) to be protected would have to survive the very first part of the stress pulse. A high clamping voltage could destroy the device to be protected.

Known silicon controlled rectifier (SCR) based devices can have very low clamping voltages due to the very deep snap back that is possible in SCRs.

Low capacitance in SCR based devices can be achieved by using a low doped region that can be depleted from carriers by a neighbouring junction: the lower the doping level the thicker the depleted region and the lower the capacitance.

Turn-on time in SCRs also depends on the thickness of the low doped regions. The thinner the low doped region, the faster the switching (the switching from the isolating to the conducting state).

Fast switching and low capacitance cannot be achieved at the same time. The low doped region would then be thin and thick at the same time.

A solution could be to use a low doped region, which is targeting for low capacitance, and avoiding punch-through with an anti-punch layer one side of the depletion layer.

As shown in FIGS. 1a, 1b and 1c, one solution is to use a higher doped p+ type layer 100 next to the right outer n+ region 102. The p− region 104 will be depleted and it will give a low capacitance due to the depletion layer 106.

However, with this approach, there is a conflict between the required capacitance (thick low doped layer) and the required switching time (thin low doped layer) since there is only one region 106 with the low capacitance.

Another way of implementing an anti-punch layer, as known in the art, is to place the inner n-diffusion in a deep p-well, as shown in FIG. 1d.

SUMMARY

Various example embodiments are directed to the disadvantage as described above and/or others which may become apparent from the following disclosure. According to an embodiment of this disclosure a semiconductor device comprises a first n+ region, a first p+ region within the first n+ region, a second n+ region, and a second p+ region, positioned between the first n+ region and the second n+ region. The first n+ region, the second n+ region and the second p+ region are positioned within a p− region.

A first space charge region and a second space charge region are formed within the p− region. The first space region is positioned between the first n+ region and the second p+ region, and the second space region is positioned between the second p+ region and the second n+ region.

In this way a SCR based esd protection device is provided with two low capacitance regions in series. Low capacitance regions are located within one doping area and separated from each other by an anti-punch region, this is a region with higher doping level.

A device according to the disclosure has two low capacitance regions (two thick depletion layers) in series. The low capacitance regions are separated from each other by an anti-punch region, this is a region with higher doping level.

Since the turn-on time depends nonlinearly on the thickness of the low doped region, two low doped regions with half the thickness will have lower turn-on time than one low doped region with the full thickness. Capacitance depends linearly on the inverse thickness of the depleted region; therefore, two depleted regions (in series) with half the thickness will have the same low capacitance as one region with the full thickness.

In that way, low capacitance and low turn-on time are possible in one device. The p− region can be a lowly doped epitaxial layer.

The first space region and the second space region are preferably 2-3 μm wide. According to an embodiment of the disclosure an electric isolating layer is arranged at the bottom of the semiconductor device.

The electric isolating layer can be:
a buried p layer, or
a buried n layer, or
a buried p layer and a buried n layer, or
a buried oxide, or
any other suitable isolating arrangement.

According to an embodiment of the disclosure the semiconductor device further comprises a side electric isolating layer.

The side electric isolating layer can be a trench or as a set of deep diffusions.

According to an embodiment of the disclosure the semiconductor device comprises a trigger connection for injecting a trigger current into the semiconductor device. The trigger current is provided by a trigger current source.

The trigger connection can be a trigger stripe positioned between the first n+ region and the second p+ region.

According to an embodiment of the disclosure he semiconductor device has a floating base and an anode, and the trigger current source is connected between the floating base and the anode.

The trigger current source is realized as:
a diode string, the diode string comprising at least 1 diode, or
an avalanche diode having a breakdown voltage in a range between 6-20V, or
a bipolar junction transistor, or
an open base bipolar junction transistor, or
a metal-oxide-silicon (MOS) transistor, or
a MOS transistor in a diode configuration, or
any other suitable trigger connection.

The trigger current source can be realized as an open base transistor having a trigger voltage below 6V and a snap back voltage below 4V.

According to an embodiment of the disclosure the semiconductor device as described in the embodiments above, can be arranged as a multi finger arrangement.

According to an embodiment of the disclosure a second semiconductor device, wherein the structure of the semiconductor device as described in the embodiments above is repeated at least 2 times, so that the second semiconductor device is a bi-directional device.

The disclosure also relates to a method for manufacturing the semiconductor device as described in the embodiments above.

The disclosure uses two space charge regions in series for lowering the capacitance. Both depleted regions are separated from each other by an anti-punch layer, this is a thin layer of higher doping that limits the depletion zones. The anti-punch layer is placed between the two depletion zones. By using two independent depletion layers both low capacitance and fast switching can be achieved.

In an embodiment of the disclosure a high doped region is used within the low doped base region, equally spaced from the neighboring emitter and collector regions.

This allows to combine low capacitance and low leakage, because punch-through is suppressed by the higher doping.

Another possibility is to leave out the higher doped base region. Then the base width must be large, meaning that the emitter collector space has to be very large, especially when considering the unavoidable process variations connected with low doping. The large distance will lead to high overshoot and high on-resistance which is both undesirable.

Another possibility is to use a trench or mould instead of the high doping region. This would avoid punch-through, because the space regions were separated by the missing silicon. The current within the SCR must flow around the trench or mould, so that both overshoot and clamping voltage would be higher.

BRIEF DESCRIPTION OF THE DRAWINGS

So that the manner in which the features of the present disclosure can be understood in detail, a more particular description is made with reference to embodiments, some of which are illustrated in the appended figures. It is to be noted, however, that the appended figures illustrate only typical embodiments and are therefore not to be considered limiting of its scope. The figures are for facilitating an understanding of the disclosure and thus are not necessarily drawn to scale.

Advantages of the subject matter claimed will become apparent to those skilled in the art upon reading this description in conjunction with the accompanying figures, in which like reference numerals have been used to designate like elements, and in which:

DETAILED DESCRIPTION

Figure 1A:
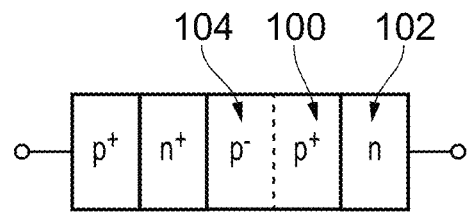
FIGS. 1a, 1b, 1c and 1d show in the devices known in the art.
Figure 1B:
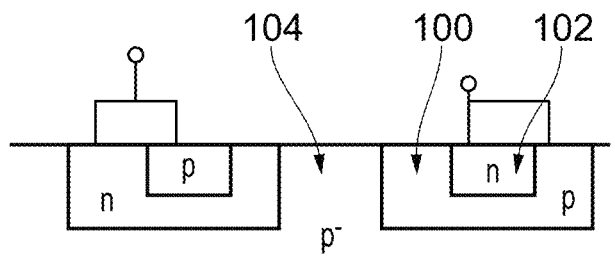
Figure 1C:
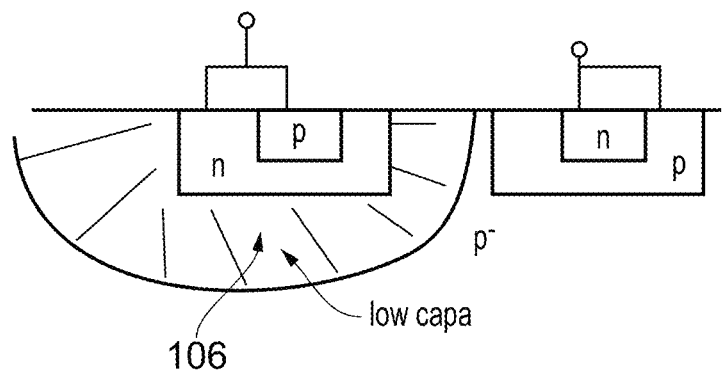
Figure 1D:
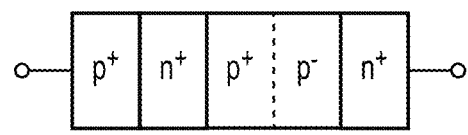

An embodiment of the disclosure is shown in FIGS. 2a, 2b, 2c and 2d.

A semiconductor device according to this embodiment comprises:
- a first n+ region 200,
- a first p+ region 202 within the first n+ region 200,
- a second n+ region 204,
- a second p+ region 206, positioned between the first n+ region 200 and the second n+ region 204,
- wherein the first n+ region 200, the second n+ region 204 and the second p+ region 206 are positioned within a p− region 208.

The semiconductor is a SCR, consisting of two coupled transistors. The pnp transistor is formed by the first p+ region 202, the first n+ region 200 and the p− region 208, including the second p+ region 206. The npn transistor is formed by the second n+ region 204, the p− region 208 and the first n+ region 200.

In this way two space charge regions are formed within the p− region 208: a first space charge region 210 and a second space charge region 212. These two space charge regions are also called depleted regions.

The second p+ region 206 is left floating. It consists of a high-doped p+ layer sandwiched between two low-doped layers (the p− region 208). The second p+ region 206 helps avoiding punch-through, the low doped layers are preferably depleted at the working voltage (the first space charge region 210 and the second space charge region 212) and reduce the capacitance of the SCR.

Figure 2A:
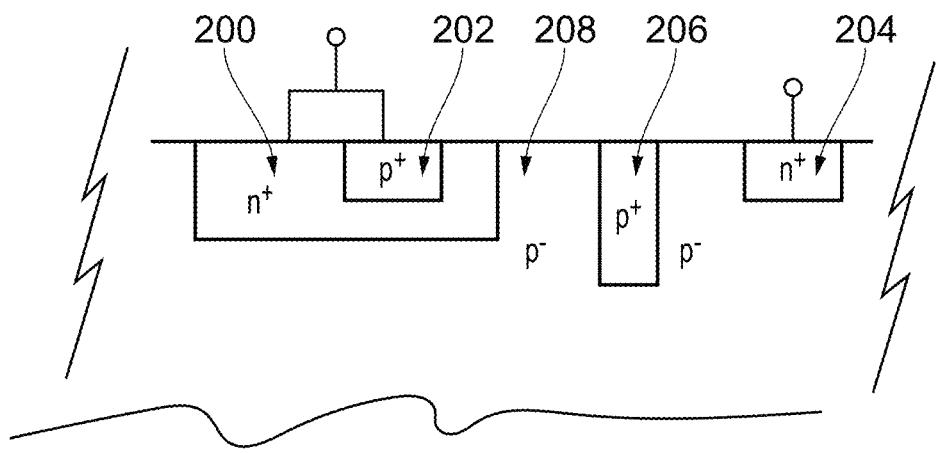
FIGS. 2a, 2b, 2c and 2d illustrate a semiconductor device according to an embodiment of the disclosure.
Figure 2B:
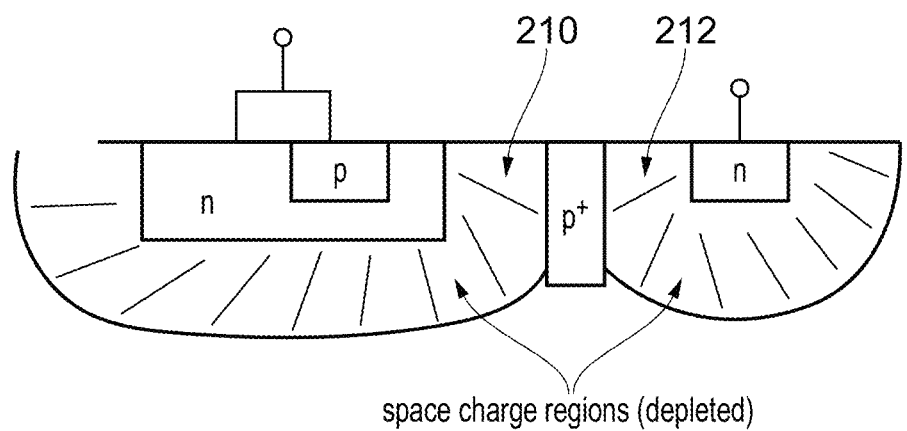
Figure 2C:
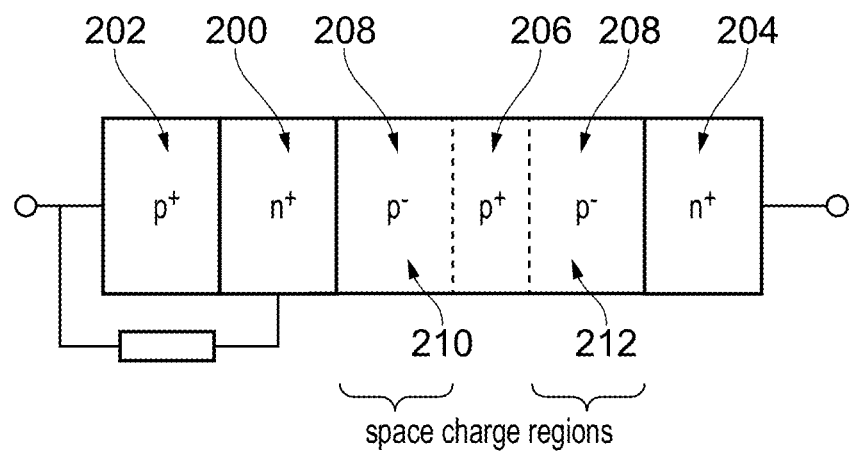
Figure 2D:
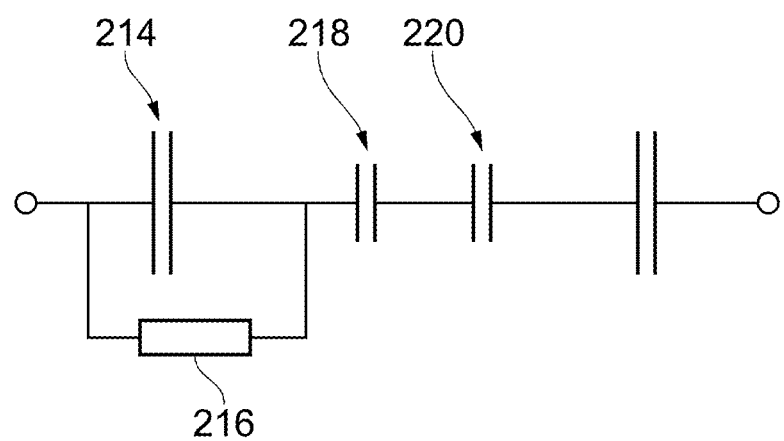

A schematic of the capacitances resulting from this embodiment are shown in FIG. 2d.

A first capacitance 214 is the large capacitance which is formed by a first p+/n+ junction, which the first p+/n+ junction is formed between the first n+ region 200 and the first p+ region 202. It is bypassed by a resistor 216.

A second capacitance 218 and a third capacitance 220 are relatively small capacitances and they correspond to the two space charge regions or the depletion regions (the first space charge region 210 and the second space charge region 212).

These two capacitances are relatively small because the space charge regions are thick, e.g. in a range of few μm.

The total capacitance of this arrangement is a half the capacitance of one of the depletion layers, i.e. a half of the second capacitance 218 or a half of the third capacitance 220.

The embodiment shown in FIGS. 2a, 2b, 2c and 2d is just one of the possibilities of forming such two low capacitance depletion layers. The disclosure is not limited to the embodiment shown in FIGS. 2a, 2b, 2c and 2d.

Figure 3A:
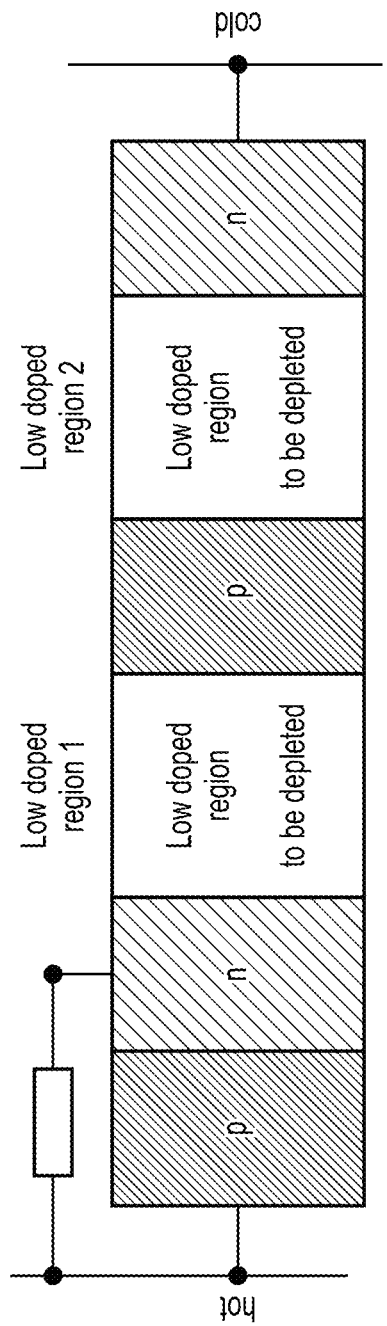
FIGS. 3a, 3b, 3c, 3d, 3e and 3f illustrate semiconductor devices according to embodiments of the disclosure.
Figure 3B:
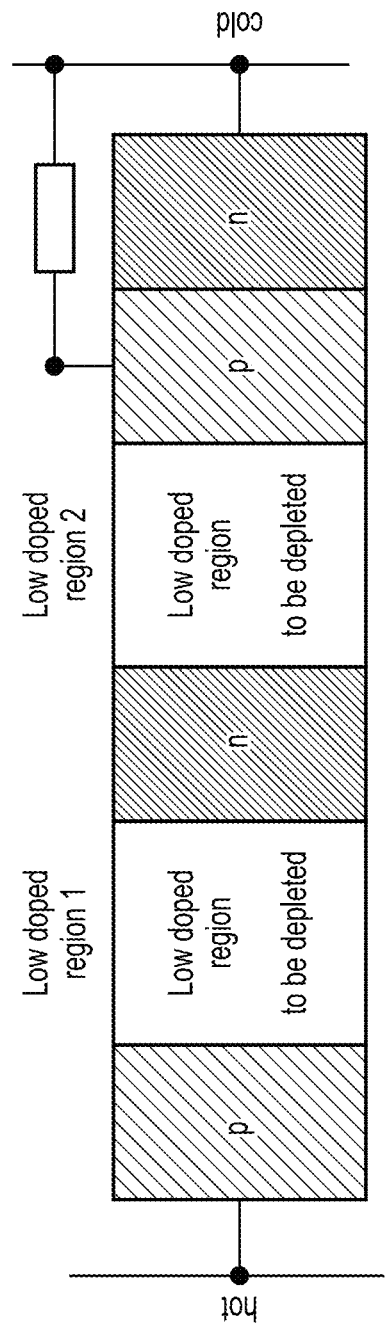

As shown in FIG. 3b, the floating base could also be the n-doped base of the pnp, instead of the p-doped base of the npn, as shown in FIG. 3a.

Figure 3C:
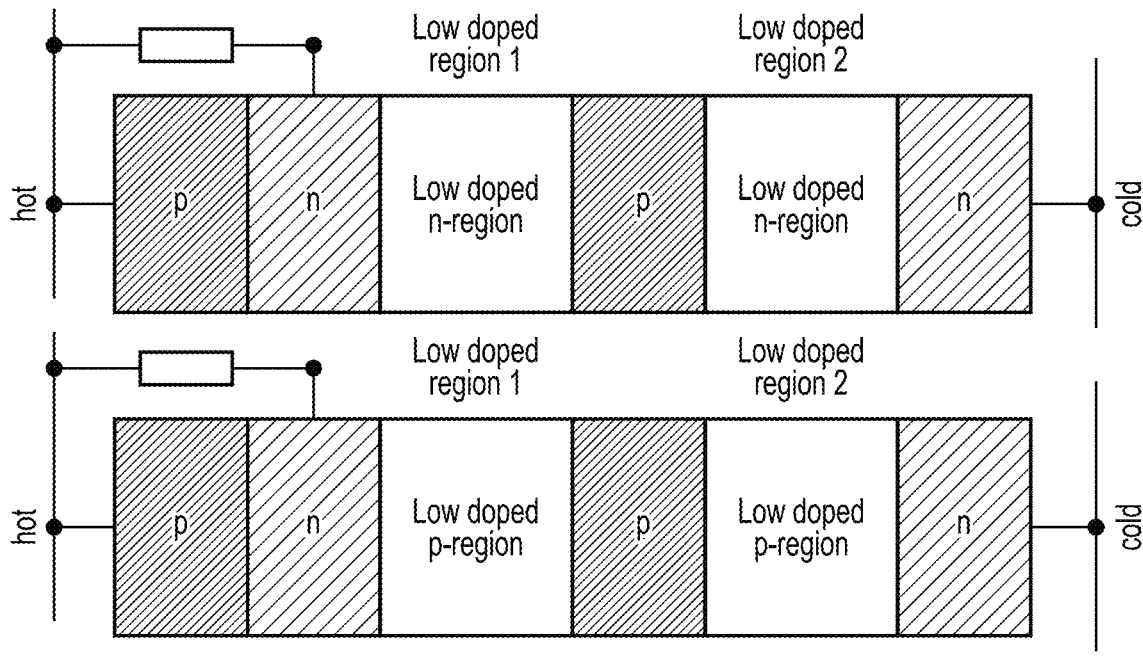
Figure 3D:
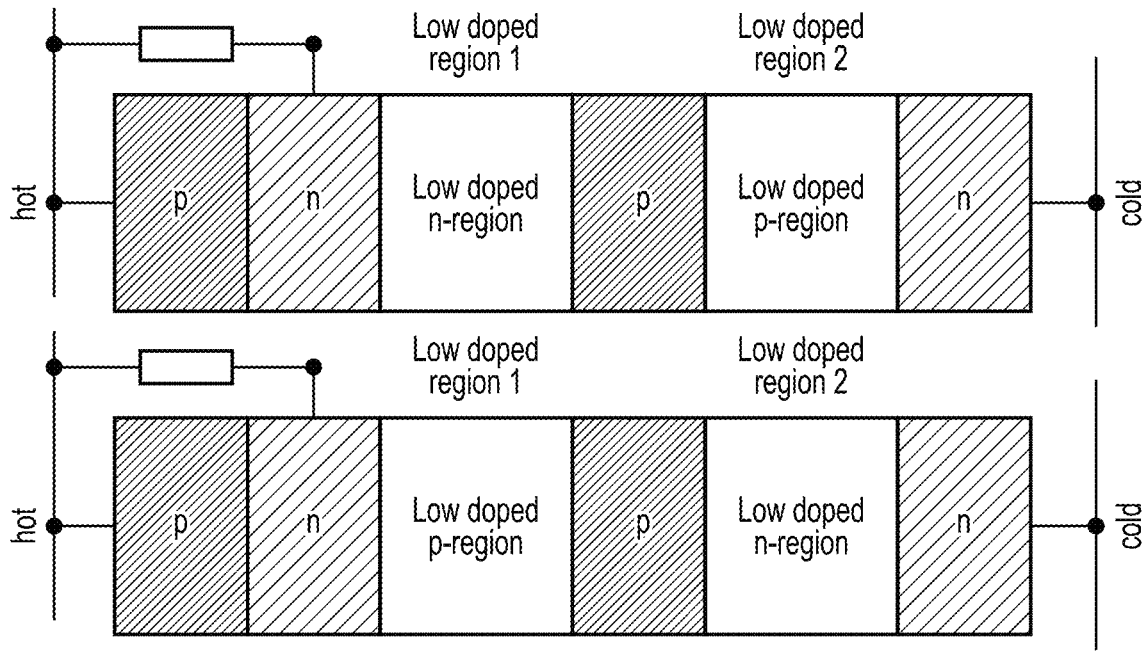

Furthermore, the low doped regions might be n-doped or p-doped, as shown in FIGS. 3c and 3d.

Figure 3E:
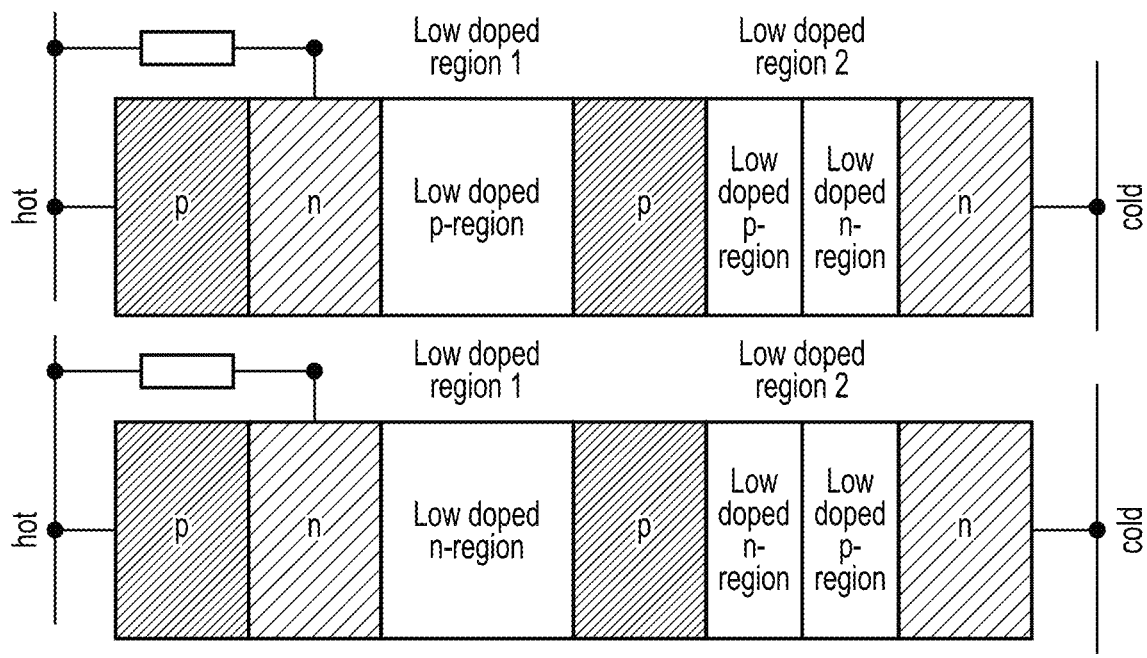
Figure 3F:
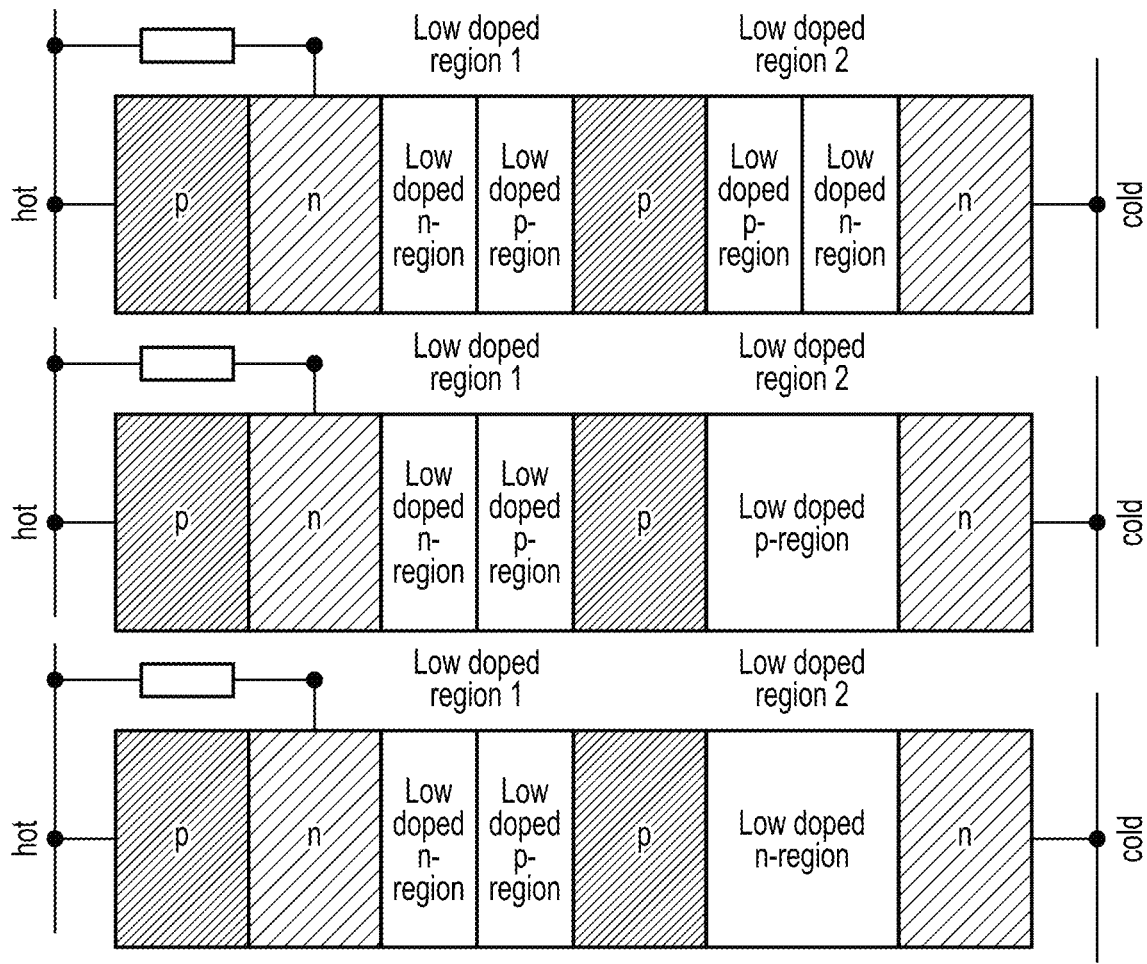

The low doped regions might even be a sandwich of n- and p-doped layers, as shown in FIGS. 3e and 3f.

Many other embodiments, i.e. combinations are possible.

Figure 4:
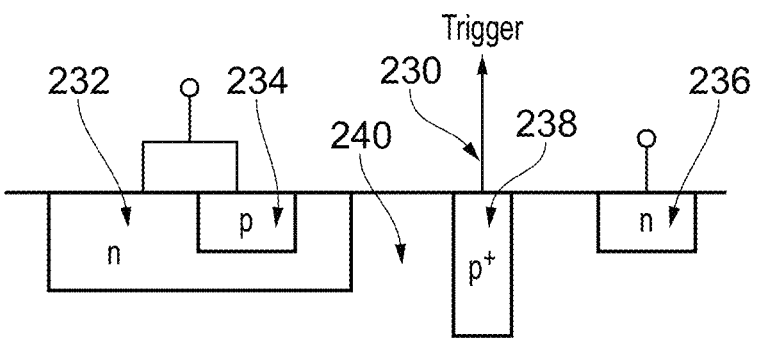
FIG. 4 illustrates a semiconductor device according to an embodiment of the disclosure.

An embodiment of the disclosure is shown in FIG. 4. In this embodiment a semiconductor device comprises a trigger connection 230. Such the trigger connection 230 defines the breakdown voltage (BV).

The semiconductor device comprises:
a trigger connection 230,
a first n+ region 232,
a first p+ region 234, within the first n+ region,
a second n+ region 236,
a second p+ region 238, positioned between the first n+ region 232 and the second n+ region 236,
wherein the first n+ region 232, the second n+ region 236 and the second p+ region 238 are positioned within a p− region 240.

At a defined BV, the trigger connection will inject current, thus forward biasing the right np junction. The injected electrons will be collected at the left n-well and cause a voltage drop in that well that will eventually forward bias the left pn junction and start the conducting mode of the SCR.

In this way there is a SCR with two low capacitance junctions in series, i.e. two thick depletion layers. I.e. two n-wells (the first n+ region and the second n+ region) are placed in a lowly doped epitaxial layer (the p− region) so that the depletion layer can expand wide, e.g. in a range of 2-3 μm. At the same time, the distance between the two n-wells must be small enough, since a long distance will cause a high overshoot voltage and a large on-resistance. If the two junctions are too near to each other it might happen that the two depletion layers merge, causing unwanted leakage currents, so-called a punch through.

Figure 5:
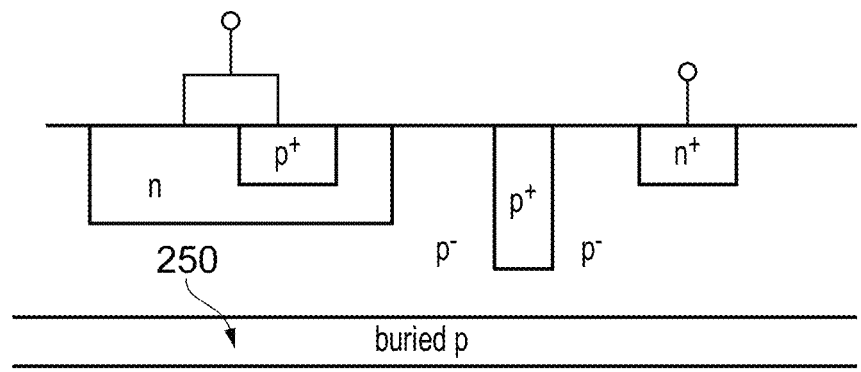
FIG. 5 illustrates a semiconductor device according to an embodiment of the disclosure.

An embodiment of the disclosure is shown in FIG. 5. In this embodiment a higher doped anti-punch layer may surround n-regions on all sides. This can be realized with a buried layer 250. The buried layer 250 can be of p-type.

Figure 6:
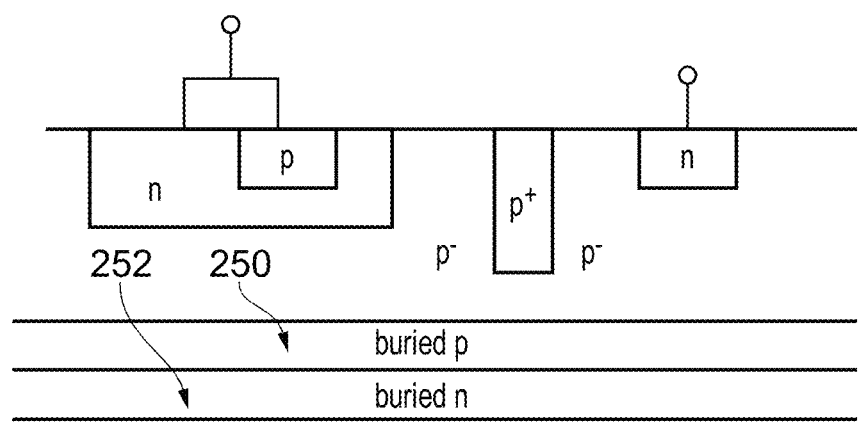
FIG. 6 illustrates a semiconductor device according to an embodiment of the disclosure.

An embodiment of the disclosure is shown in FIG. 6. In this case the semiconductor device comprises two buried layers: a first buried layer 250 and a second buried layer 252. The first buried layer 250 can be of p-type, the second buried layer 252 can be of n-type. These two buried layers additionally isolate the SCR from the carrier substrate.

Figure 7A:
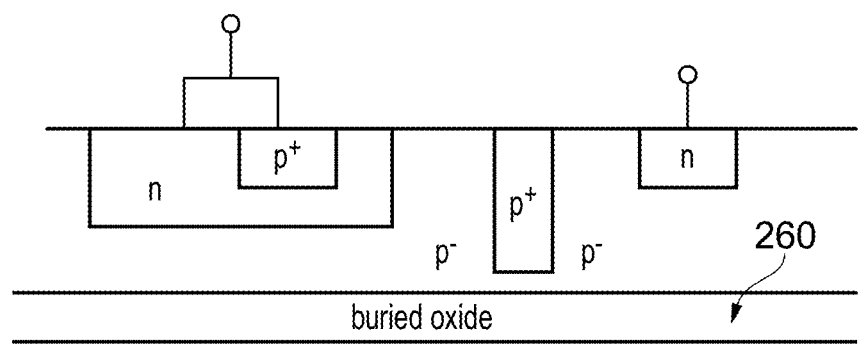
FIGS. 7a and 7b illustrate semiconductor devices according to embodiments of the disclosure.
Figure 7B:
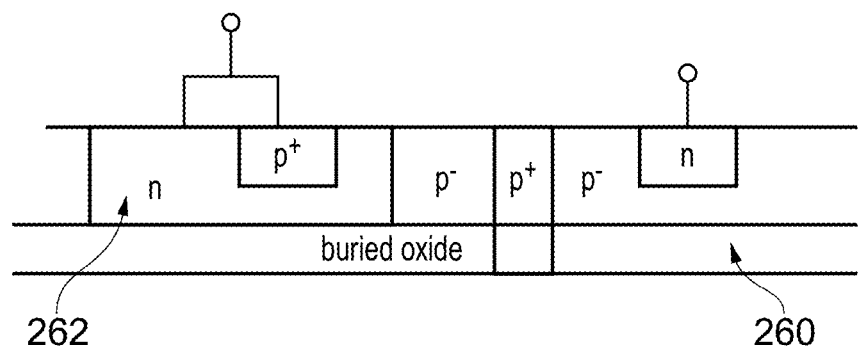

Embodiments of the disclosure are shown in FIGS. 7a and 7b. In this case the SCR is isolated from the carrier substrate with a buried oxide 260. The buried oxide 260 can be based on silicon on insulator (SOI) technology. The embodiment shown in FIG. 7b comprises a buried oxide 260 that is touching the first n region 262.

Figure 8A:
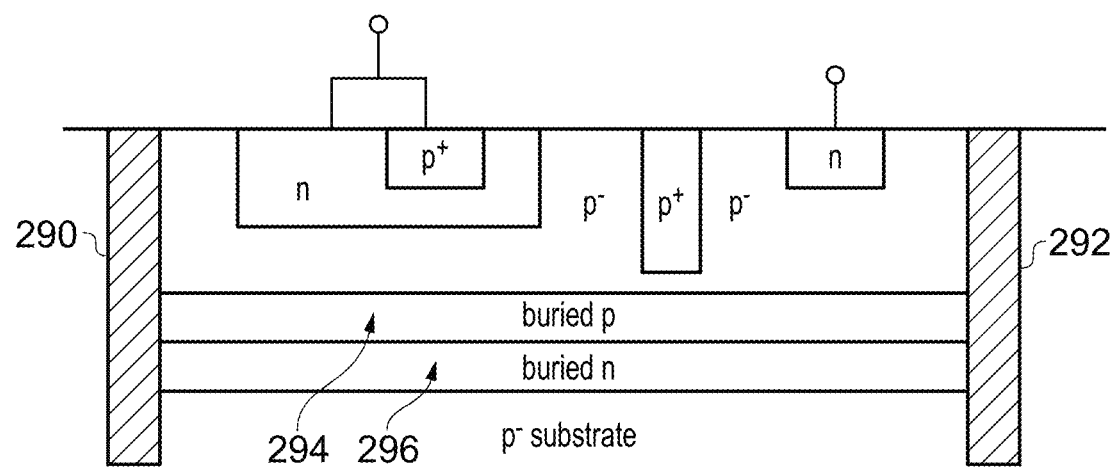
FIGS. 8a and 8b illustrate semiconductor devices according to embodiments of the disclosure.
Figure 8B:
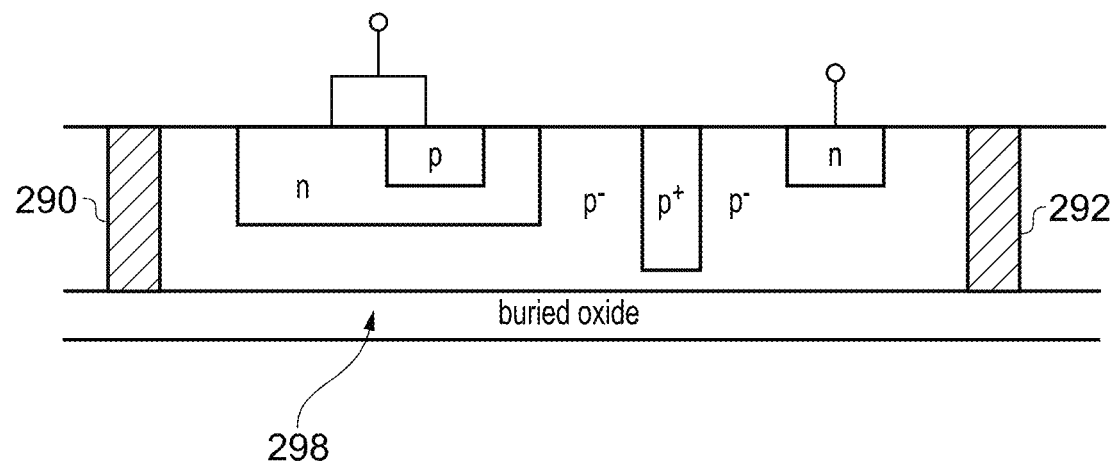

Embodiment of the disclosure are shown in FIGS. 8a and 8b. In these embodiments a sidewall isolation is provided. This can be implemented by a first sidewall isolation 290 and a second sidewall isolation 292. The sidewall isolation 290, 292 can be implemented as trenches or diffusions.

The embodiment shown in FIG. 8a shows a semiconductor device comprising a first buried layer 294 and a second buried layer 296, the second buried layer 296 positioned below the first buried layer 294.

The embodiment shown in FIG. 8b shows a semiconductor device comprising a buried oxide 298.

Figure 9:
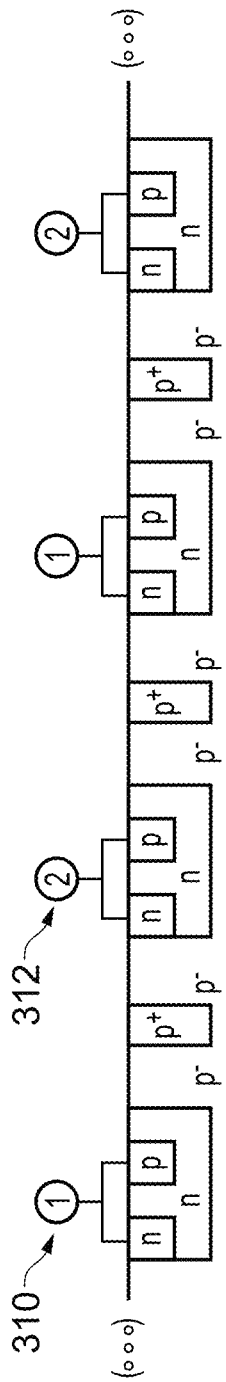
FIG. 9 illustrates a semiconductor device according to an embodiment of the disclosure.

The previous embodiments relate to a one-direction-only SCR. However, the disclosure is also related to a two-direction/bidirectional SCR. The two-direction SCR behaves similar for both polarities. One possibility to realize a two-direction SCR is to copy the whole structure of a one-direction-only SCR and pasting it with a lateral shift. The bidirectional concept can easily be extended to a multi finger array structure with many SCRs in parallel. An embodiment of the disclosure is shown in FIG. 9.

Figure 10:
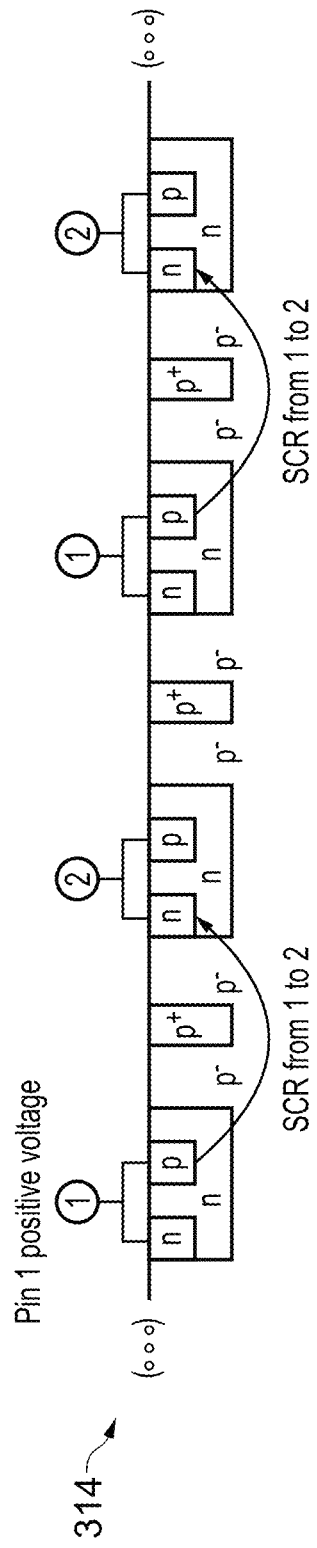
FIG. 10 illustrates a semiconductor device according to an embodiment of the disclosure.

In an embodiment of the disclosure shown in FIG. 10, a symmetry of the semiconductor device is illustrated, which explains the above mentioned multi finger structure arrangement.

The current goes always to right, regardless if pin 1 (reference 310 in FIG. 9) is having a positive voltage (reference 314 in FIG. 10) or pin 2 (reference 312 in FIG. 9) is having a positive voltage (reference 316 in FIG. 10).

Figure 11:
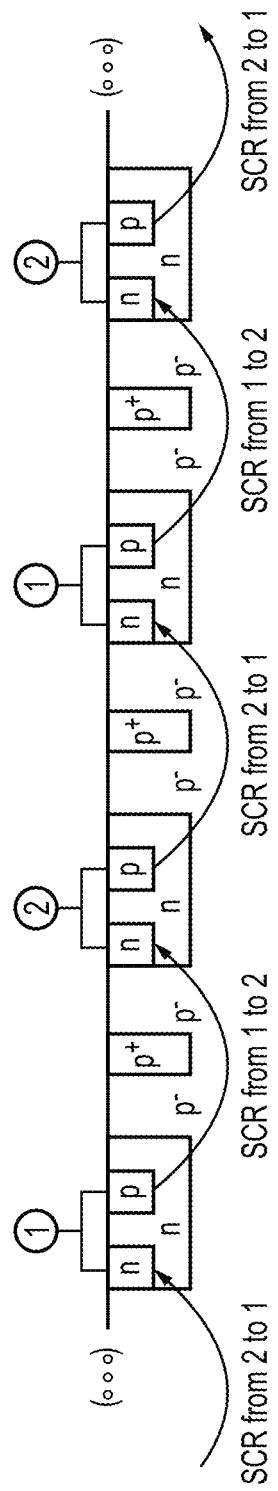
FIG. 11 illustrates a semiconductor device according to an embodiment of the disclosure.

As shown in FIG. 11, the current paths for positive and for negative voltage at pin 1 do not overlap, since they are placed at separate positions in the semiconductor device. Furthermore, the current direction is identical for both polarities.

This could be described as a lateral symmetry. If the semiconductor device will be moved with a fixed pitch in the lateral direction, it will be identical there.

Figure 12:
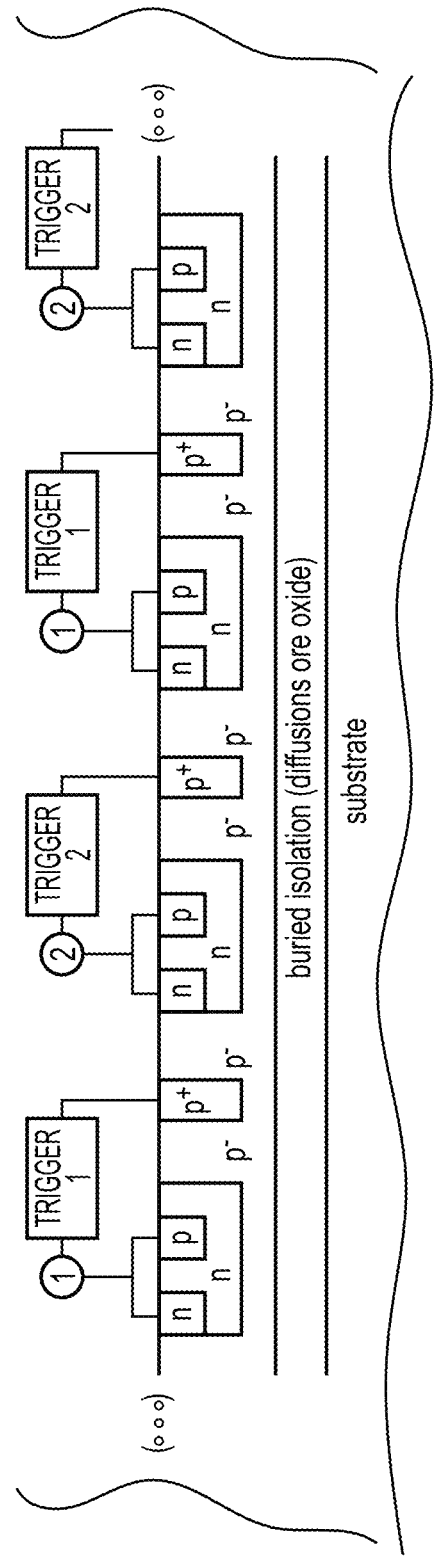
FIG. 12 illustrates a semiconductor device according to an embodiment of the disclosure.

An embodiment of the disclosure is shown in FIG. 11. This is a multi finger structure arrangement, with a buried isolation and a trigger injection, as shown in FIG. 12.

Figure 13:
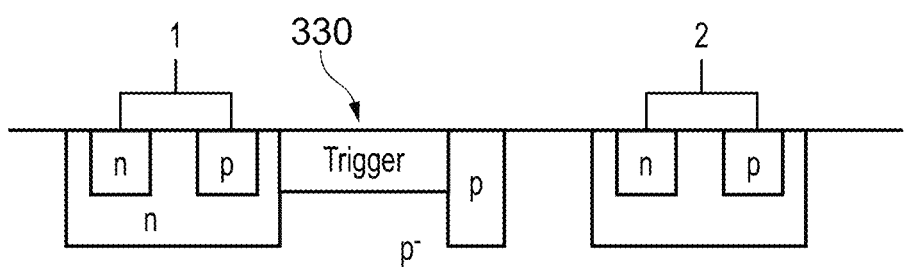
FIG. 13 illustrates a semiconductor device according to an embodiment of the disclosure.

In an embodiment of the disclosure, as shown in FIG. 13, local a trigger stripe 330 can be used instead of a trigger connection (as shown in FIG. 4, with the reference number 230).

This semiconductor device with the local trigger stripe can be combined with the isolation methods, as described in the embodiments above, and can also be arranged in a multi-finger arrangement.

The breakdown voltage between the trigger stripe and the n-well can be tailored to an actual voltage target.

Figure 14:
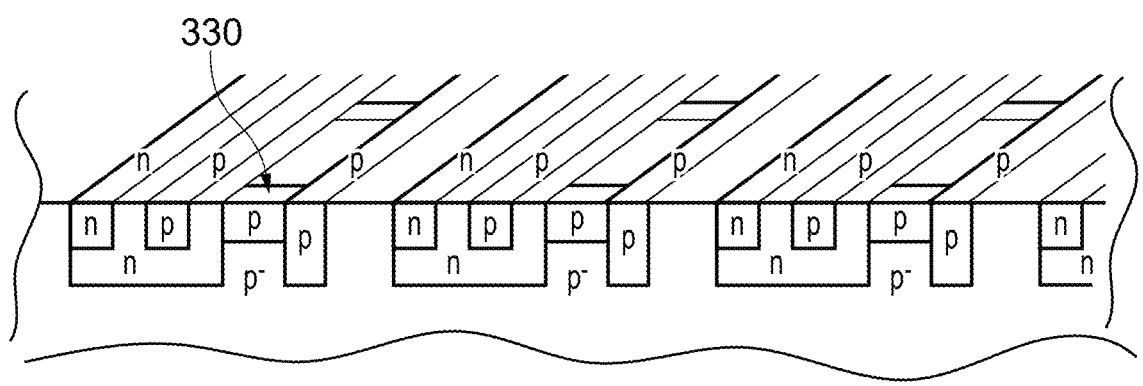
FIG. 14 illustrates a semiconductor device according to an embodiment of the disclosure.

The trigger stripes 330 in a multi-finger arrangement are shown in an embodiment if the disclosure in FIG. 14.

A trigger current is provided by an open base structure. This a npn transistor with a floating base. The breakdown voltage is well below 6 Volts, nonetheless, the trigger has a low leakage current. Therefore, the SCR will have a trigger voltage below 6 Volt. In order to keep the parasitic capacitance small, the trigger device has to be small. But it has to be big enough to be able to deliver the necessary trigger current.

Figure 15:
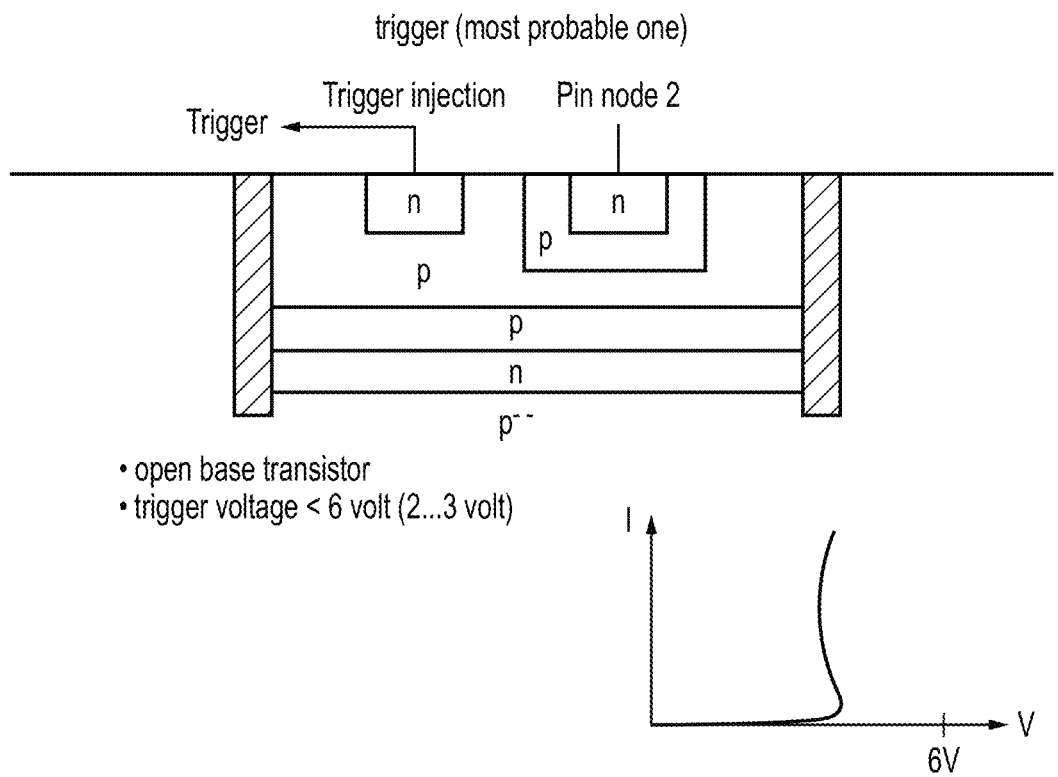
FIG. 15 illustrates a semiconductor device according to an embodiment of the disclosure and a related current-voltage diagram.

A cross section of such a semiconductor device is shown in FIG. 15. As it is shown in FIG. 15, below 6V there is still not leakage. The trigger voltage is much bellow 6V, i.e. 2-3V.

The breakdown voltage can be fine-tuned with a dedicated p-well diffusion. The layout will be optimized for the best combination of a low voltage at a trigger current and a low parasitic capacitance.

In this way transistors can be built so that the gain is large for low current levels. For such open base transistors the snap back voltage is reached at low current levels. The snap back can be reduced drastically.

Figure 16:
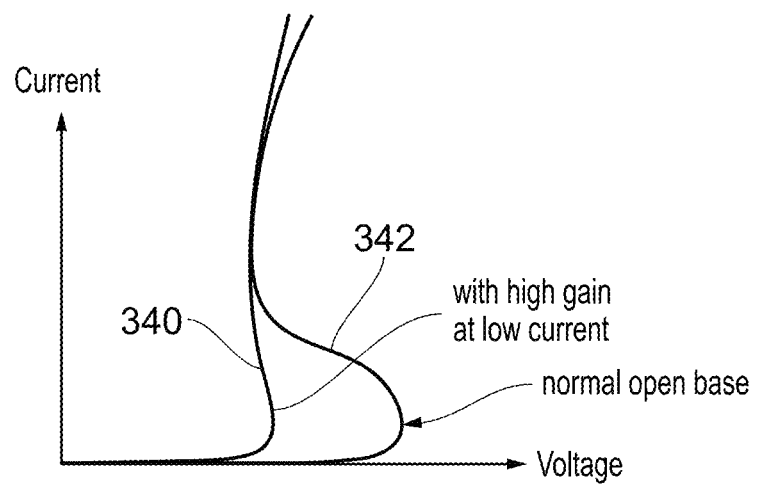
FIG. 16 illustrates a current-voltage diagram of a semiconductor device according to an embodiment of the disclosure.

The difference in the current-voltage dependency between an open base transistor according to an embodiment of the disclosure 340 and a normal open base transistor 342 is shown in FIG. 16.

The open base transistor according to an embodiment of the disclosure is having the advantage that it can reach a breakdown voltage down to 2-4 V and still have very low leakage currents.

It is possible to optimize such an open base transistor, so that a large current gain is achieved at low current levels, with no snap back, with a breakdown voltage of the base collector junction well above 7 V and a very low leakage for this junction.

Figure 17A:
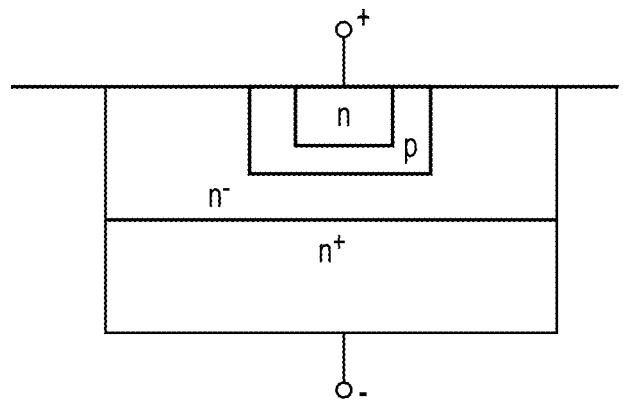
FIGS. 17a, 17b and 17c illustrate semiconductor devices according to embodiments of the disclosure.
Figure 17B:
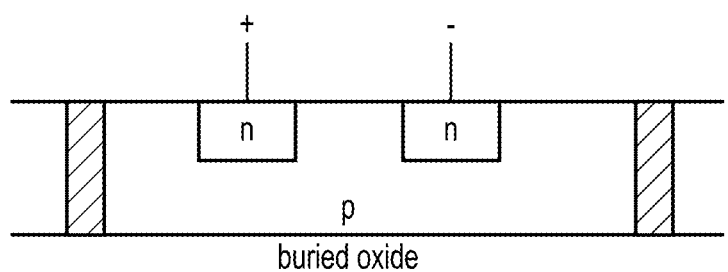
Figure 17C:
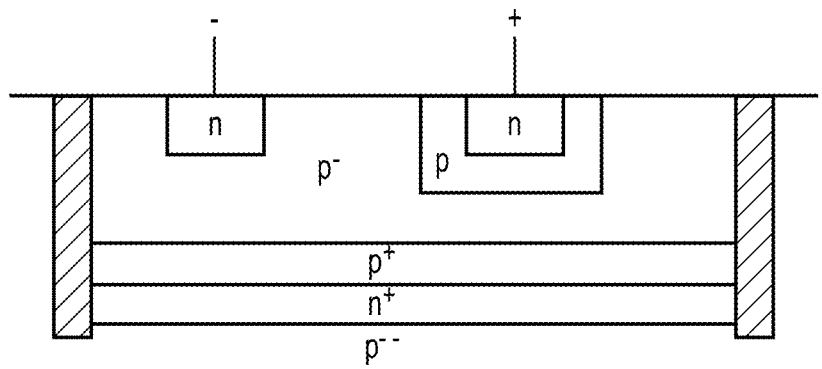

Three exemplary embodiments of the disclosure for the open base transistors are shown in FIGS. 17a, 17b and 17c.

A vertical transistor is shown in FIG. 17a. Here the gain is high at low currents because the base is nearly the same size as the collector. The overlap of p and n is minimized, so that the electrons that are injected from the emitter cannot go astray.

A transistor based in a process using a silicon on an insulator is shown in FIG. 17b. Here the buried oxide acts as a barrier for the emitted electrons, so that nearly all injected electrons end in the collector.

A third embodiment of an open base transistor is shown in FIG. 17c. The buried p-layer reflects the injected electrons. This improves the current gain for low current levels. This open base transistor has a breakdown voltage of about 3 V and a very low leakage current. It is therefore best used as a trigger current source for a SCR. The SCR than shows a very low trigger voltage and low leakage current.

Particular and preferred aspects of the disclosure are set out in the accompanying independent claims. Combinations of features from the dependent and/or independent claims may be combined as appropriate and not merely as set out in the claims.

The scope of the present disclosure includes any novel feature or combination of features disclosed therein either explicitly or implicitly or any generalisation thereof irrespective of whether or not it relates to the claimed disclosure or mitigate against any or all of the problems addressed by the present disclosure. The applicant hereby gives notice that new claims may be formulated to such features during prosecution of this application or of any such further application derived therefrom. In particular, with reference to the appended claims, features from dependent claims may be combined with those of the independent claims and features from respective independent claims may be combined in any appropriate manner and not merely in specific combinations enumerated in the claims.

Features which are described in the context of separate embodiments may also be provided in combination in a single embodiment. Conversely, various features which are, for brevity, described in the context of a single embodiment, may also be provided separately or in any suitable sub combination.

The term "comprising" does not exclude other elements or steps, the term "a" or "an" does not exclude a plurality. Reference signs in the claims shall not be construed as limiting the scope of the claims.

What is claimed is:

1. A semiconductor device comprising:
    a first n+ region,
    a first p+ region within the first n+ region,
    a second n+ region,
    a second p+ region positioned between the first n+ region and the second n+ region,
    wherein the first n+ region, the second n+ region and the second p+ region are positioned within a p− region;
    a first space charge region and a second space charge region are formed within the p− region; and
    wherein the first space charge region is positioned between the first n+ region and the second p+ region, and the second space charge region is positioned between the second p+ region and the second n+ region.

2. The semiconductor device as claimed in claim 1, wherein the p− region is a lowly doped epitaxial layer.

3. The semiconductor device as claimed in claim 2, wherein all polarities are inverted, so that all p-doping regions are n-doping regions and all n-doping regions are p-doping regions.

4. The semiconductor device as claimed in claim 2, wherein the first space charge region and the second space charge region are 2 to 3 μm wide.

5. The semiconductor device as claimed in claim 1, wherein all polarities are inverted, so that all p-doping regions are n-doping regions and all n-doping regions are p-doping regions.

6. The semiconductor device as claimed in claim 5, wherein the first space charge region and the second space charge region are 2 to 3 μm wide.

7. The semiconductor device as claimed in claim 1, wherein the first space charge region and the second space charge region are 2 to 3 μm wide.

8. The semiconductor device as claimed in claim 1, wherein the semiconductor device has an electric isolating layer arranged at a bottom thereof.

9. The semiconductor device as claimed in claim 8, wherein the electric isolating layer is a buried layer selected from the group consisting of a buried p layer, a buried n layer and a buried n layer, a buried p layer and a buried n layer, a buried oxide, and any combination thereof.

10. The semiconductor device as claimed in claim 1, further comprising a side electric isolating layer.

11. The semiconductor device as claimed in claim 10, wherein the side electric isolating layer is a trench or as a set of deep diffusions.

12. The semiconductor device as claimed in claim 1, further comprising a trigger connection for injecting a trigger current into the semiconductor device.

13. The semiconductor device as claimed in claim 12, wherein the trigger connection is a trigger stripe positioned between the first n+ region and the second p+ region.

14. The semiconductor device as claimed in claim 12, further comprising a floating base and an anode, and wherein the trigger connection is connected between the floating base and the anode.

15. The semiconductor device as claimed in claim 12, wherein the trigger connection is selected from the group consisting of:
    a diode string, the diode string comprising at least one diode,
    an avalanche diode having a breakdown voltage in a range between 6-20V,
    a bipolar junction transistor,
    an open base bipolar junction transistor,
    a metal—oxide—silicon (MOS) transistor,
    a MOS transistor in a diode configuration, and
    any combination thereof.

16. The semiconductor device as claimed in claim 12, wherein the trigger current source is an open base transistor having a trigger voltage below 6V and a snap back voltage below 4V.

17. The semiconductor device as claimed in claim 1, wherein the semiconductor device is arranged as a multi finger arrangement.

18. A second semiconductor device, wherein the semiconductor device has a structure as claimed in claim 1, that is repeated at least two times, and wherein the second semiconductor device is a bi-directional device.

19. A method for manufacturing the semiconductor device as claimed in claim 1.

\* \* \* \* \*